(12) United States Patent
Cronie et al.

(10) Patent No.: US 9,268,683 B1
(45) Date of Patent: Feb. 23, 2016

(54) STORAGE METHOD AND APPARATUS FOR RANDOM ACCESS MEMORY USING CODEWORD STORAGE

(71) Applicant: Kandou Labs, S.A., Lausanne (CH)

(72) Inventors: Harm Cronie, Lausanne (CH); Amin Shokrollahi, Prevérenges (CH)

(73) Assignee: KANDOU LABS, S.A. (CH)

( * ) Notice: Subject to any disclaimer, the term of this patent is extended or adjusted under 35 U.S.C. 154(b) by 257 days.

(21) Appl. No.: 13/844,032

(22) Filed: Mar. 15, 2013

Related U.S. Application Data

(60) Provisional application No. 61/646,790, filed on May 14, 2012.

(51) Int. Cl.
*G11C 29/00* (2006.01)
*H03M 13/00* (2006.01)
*G06F 12/02* (2006.01)
*G06F 11/10* (2006.01)
(Continued)

(52) U.S. Cl.
CPC ........ *G06F 12/0246* (2013.01); *G06F 11/1008* (2013.01); *G11C 11/5621* (2013.01); *H03M 13/09* (2013.01)

(58) Field of Classification Search
CPC ... G06F 11/167; G06F 11/00; G06F 11/1048; G06F 11/1008; G06F 12/0246; G11C 11/5621; G11C 2211/5641; H03M 13/09
USPC ........... 371/763, 773, 778, 758; 365/189.011, 365/189.04, 189.14, 189.15, 189.16, 201
See application file for complete search history.

(56) References Cited

U.S. PATENT DOCUMENTS 3,636,463 A 1/1972 Ongkiehong
3,939,468 A 2/1976 Mastin
(Continued)

FOREIGN PATENT DOCUMENTS

CN 101478286 7/2009
EP 2039221 B1 3/2009
(Continued)

OTHER PUBLICATIONS

International Search Report and Written Opinion of the International Searching Authority, mailed Nov. 5, 2012, in International Patent Application S.N. PCT/EP2012/052767, 7 pages.
(Continued)

*Primary Examiner* — Christine Tu
(74) *Attorney, Agent, or Firm* — Invention Mine LLC (57) ABSTRACT

A memory circuit, such as an embedded DRAM array, stores information as groups of bits or data using information coding in storage and retrieval data, instead of each bit being stored separately. Write data words can be mapped to storage format words that are stored and defined by a Hadamard matrix. The storage format word is stored as charge levels in an addressable memory location. For retrieving stored data, charge levels are read from the storage cells and interpreted to a valid storage format word. Hadamard code maximal likelihood decoding can be used to derive a read data word corresponding to a previously written write data word. The write data word is then output as the result of a read of the selected addressable location, or a portion thereof. The mapping can be two or more Hadamard matrix mappings concatenated for each of a plurality of storage format words.

20 Claims, 6 Drawing Sheets

(51) Int. Cl.
*G11C 11/56* (2006.01)
*H03M 13/09* (2006.01)

(56) References Cited

U.S. PATENT DOCUMENTS

| | | | |
|---|---|---|---|
| 4,163,258 A | 7/1979 | Ebihara et al. | |
| 4,181,967 A | 1/1980 | Nash et al. | |
| 4,206,316 A | 6/1980 | Burnsweig et al. | |
| 4,486,739 A | 12/1984 | Franaszeck et al. | |
| 4,499,550 A | 2/1985 | Ray et al. | |
| 4,580,162 A * | 4/1986 | Mori | 348/400.1 |
| 4,864,303 A | 9/1989 | Ofek | |
| 5,053,974 A | 10/1991 | Penz | |
| 5,166,956 A | 11/1992 | Baltus et al. | |
| 5,168,509 A | 12/1992 | Nakamura et al. | |
| 5,283,761 A | 2/1994 | Gillingham | |
| 5,412,689 A | 5/1995 | Chan et al. | |
| 5,511,119 A | 4/1996 | Lechleider | |
| 5,553,097 A | 9/1996 | Dagher | |
| 5,599,550 A | 2/1997 | Kohlruss et al. | |
| 5,659,353 A | 8/1997 | Kostreski et al. | |
| 5,825,808 A | 10/1998 | Hershey et al. | |
| 5,995,016 A | 11/1999 | Perino | |
| 6,005,895 A | 12/1999 | Perino et al. | |
| 6,084,883 A | 7/2000 | Norrell et al. | |
| 6,172,634 B1 | 1/2001 | Leonowich et al. | |
| 6,175,230 B1 | 1/2001 | Hamblin et al. | |
| 6,278,740 B1 | 8/2001 | Nordyke | |
| 6,359,931 B1 | 3/2002 | Perino et al. | |
| 6,404,820 B1 | 6/2002 | Postol | |
| 6,417,737 B1 | 7/2002 | Moloudi et al. | |
| 6,452,420 B1 | 9/2002 | Wong | |
| 6,504,875 B2 | 1/2003 | Perino et al. | |
| 6,509,773 B2 | 1/2003 | Buchwald | |
| 6,556,628 B1 | 4/2003 | Poulton et al. | |
| 6,563,382 B1 | 5/2003 | Yang et al. | |
| 6,621,427 B2 | 9/2003 | Greenstreet | |
| 6,650,638 B1 | 11/2003 | Walker et al. | |
| 6,661,355 B2 | 12/2003 | Cornelius et al. | |
| 6,766,342 B2 | 7/2004 | Kechriotis | |
| 6,839,429 B1 | 1/2005 | Gaikwad et al. | |
| 6,954,492 B1 | 10/2005 | Williams | |
| 6,990,138 B2 | 1/2006 | Bejjani et al. | |
| 6,999,516 B1 | 2/2006 | Rajan | |
| 7,053,802 B2 | 5/2006 | Cornelius | |
| 7,085,153 B2 | 8/2006 | Ferrant et al. | |
| 7,142,612 B2 | 11/2006 | Horowitz et al. | |
| 7,167,019 B2 | 1/2007 | Broyde et al. | |
| 7,180,949 B2 | 2/2007 | Kleveland et al. | |
| 7,184,483 B2 | 2/2007 | Rajan | |
| 7,356,213 B1 | 4/2008 | Cunningham et al. | |
| 7,358,869 B1 | 4/2008 | Chiarulli et al. | |
| 7,362,130 B2 | 4/2008 | Broyde et al. | |
| 7,389,333 B2 | 6/2008 | Moore et al. | |
| 7,633,850 B2 | 12/2009 | Ahn | |
| 7,656,321 B2 | 2/2010 | Wang | |
| 7,706,524 B2 | 4/2010 | Zerbe | |
| 7,746,764 B2 | 6/2010 | Rawlins et al. | |
| 7,787,572 B2 | 8/2010 | Scharf et al. | |
| 7,836,364 B1 * | 11/2010 | Sutardja et al. | 714/723 |
| 7,882,413 B2 | 2/2011 | Chen et al. | |
| 7,933,770 B2 | 4/2011 | Kruger et al. | |
| 8,064,535 B2 | 11/2011 | Wiley | |
| 8,091,006 B2 | 1/2012 | Prasad et al. | |
| 8,159,375 B2 | 4/2012 | Abbasfar | |
| 8,159,376 B2 | 4/2012 | Abbasfar | |
| 8,279,094 B2 | 10/2012 | Abbasfar | |
| 8,429,495 B2 | 4/2013 | Przybylski | |
| 8,442,099 B1 | 5/2013 | Sederat | |
| 8,442,210 B2 | 5/2013 | Zerbe | |
| 8,443,223 B2 | 5/2013 | Abbasfar | |
| 8,462,891 B2 | 6/2013 | Kizer et al. | |
| 8,520,493 B2 | 8/2013 | Goulahsen | |
| 8,547,272 B2 | 10/2013 | Nestler et al. | |
| 8,588,280 B2 | 11/2013 | Oh et al. | |
| 8,593,305 B1 | 11/2013 | Tajalli et al. | |
| 8,649,445 B2 | 2/2014 | Cronie | |
| 8,649,460 B2 | 2/2014 | Ware et al. | |
| 8,718,184 B1 | 5/2014 | Cronie | |
| 8,782,578 B2 | 7/2014 | Tell | |
| 8,989,317 B1 | 3/2015 | Holden | |
| 2001/0055344 A1 | 12/2001 | Lee et al. | |
| 2002/0034191 A1 | 3/2002 | Shattil | |
| 2002/0057592 A1 | 5/2002 | Robb | |
| 2003/0071745 A1 | 4/2003 | Greenstreet | |
| 2003/0105908 A1 | 6/2003 | Perino et al. | |
| 2003/0146783 A1 | 8/2003 | Bandy et al. | |
| 2003/0227841 A1 | 12/2003 | Tateishi et al. | |
| 2004/0054877 A1 * | 3/2004 | Macy et al. | 712/221 |
| 2004/0057525 A1 | 3/2004 | Rajan et al. | |
| 2004/0086059 A1 | 5/2004 | Eroz et al. | |
| 2005/0135182 A1 | 6/2005 | Perino et al. | |
| 2005/0152385 A1 | 7/2005 | Cioffi | |
| 2005/0174841 A1 | 8/2005 | Ho | |
| 2005/0286643 A1 | 12/2005 | Ozawa et al. | |
| 2006/0159005 A1 | 7/2006 | Rawlins et al. | |
| 2007/0260965 A1 | 11/2007 | Schmidt et al. | |
| 2007/0263711 A1 | 11/2007 | Kramer et al. | |
| 2007/0283210 A1 | 12/2007 | Prasad et al. | |
| 2008/0104374 A1 | 5/2008 | Mohamed | |
| 2008/0159448 A1 | 7/2008 | Anim-Appiah et al. | |
| 2008/0169846 A1 | 7/2008 | Lan et al. | |
| 2008/0273623 A1 | 11/2008 | Chung et al. | |
| 2009/0059782 A1 | 3/2009 | Cole | |
| 2009/0092196 A1 | 4/2009 | Okunev | |
| 2009/0132758 A1 | 5/2009 | Jiang | |
| 2009/0154500 A1 | 6/2009 | Diab et al. | |
| 2009/0185636 A1 | 7/2009 | Palotai et al. | |
| 2009/0212861 A1 | 8/2009 | Lim et al. | |
| 2009/0228767 A1 | 9/2009 | Oh et al. | |
| 2009/0257542 A1 | 10/2009 | Evans et al. | |
| 2010/0104047 A1 | 4/2010 | Chen et al. | |
| 2010/0122021 A1 | 5/2010 | Lee et al. | |
| 2010/0180143 A1 | 7/2010 | Ware et al. | |
| 2010/0205506 A1 | 8/2010 | Hara | |
| 2010/0296550 A1 | 11/2010 | Abou Rjeily | |
| 2011/0051854 A1 | 3/2011 | Kizer et al. | |
| 2011/0084737 A1 | 4/2011 | Oh et al. | |
| 2011/0127990 A1 | 6/2011 | Wilson et al. | |
| 2011/0235501 A1 | 9/2011 | Goulahsen | |
| 2011/0268225 A1 | 11/2011 | Cronie et al. | |
| 2011/0299555 A1 | 12/2011 | Cronie et al. | |
| 2011/0302478 A1 | 12/2011 | Cronie et al. | |
| 2011/0317559 A1 | 12/2011 | Kern et al. | |
| 2012/0063291 A1 | 3/2012 | Hsueh | |
| 2012/0213299 A1 | 8/2012 | Cronie et al. | |
| 2013/0010892 A1 | 1/2013 | Cronie et al. | |
| 2013/0051162 A1 | 2/2013 | Amirkhany et al. | |
| 2014/0254730 A1 | 9/2014 | Kim et al. | |
| 2015/0078479 A1 | 3/2015 | Whitby-Stevens | |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

International Search Report and Written Opinion of the International Searching Authority, mailed Jul. 14, 2011 in International Patent Application S.N. PCT/EP2011/002170, 10 pages.

Healey, A., et al., "A Comparison of 25 Gbps NRZ & PAM-4 Modulation used in Legacy & Premium Backplane Channels", DesignCon 2012, 16 pages.

International Search Report for PCT/US2014/053563, dated Nov. 11, 2014, 2 pages.

Clayton, P., "Introduction to Electromagnetic Compatibility", Wiley-Interscience, 2006.

She et al., "A Framework of Cross-Layer Superposition Coded Multicast for Robust IPTV Services over WiMAX," IEEE Commu- (56) References Cited

OTHER PUBLICATIONS nications Society subject matter experts for publication in the WCNC 2008 proceedings, Mar. 31, 2008-Apr. 3, 2008, pp. 3139-3144.
Poulton, et al., "Multiwire Differential Signaling", UNC-CH Department of Computer Science Version 1.1, Aug. 6, 2003.
Skliar et al., A Method for the Analysis of Signals: the Square-Wave Method, Mar. 2008, Revista de Matematica: Teoria y Aplicationes, pp. 09-129.
International Search Report and Written Opinion from PCT/US2014/034220 mailed Aug. 21, 2014.
International Search Report and Written Opinion for PCT/US14/052986 mailed Nov. 24, 2014.
Burr, "Spherical Codes for M-ARY Code Shift Keying", University of York, Apr. 2, 1989, pp. 67-72, United Kingdom.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallani, L., et al., "Transmission Time Analysis for the Parallel Asynchronous Communication Scheme", IEEE Tranactions on Computers, vol. 52, No. 5, May 2003, pp. 558-571.
International Search Report and Written Opinion for PCT/EP2012/052767 mailed May 11, 2012.
International Search Report and Written Opinion for PCT/EP2011/059279 mailed Sep. 22, 2011.
International Search Report and Written Opinion for PCT/EP2011/074219 mailed Jul. 4, 2012.
Notification of Transmittal of the International Search Report and The Written Opinion of the International Searching Authority, or the Declaration for PCT/EP2013/002681, dated Feb. 25, 2014, 15 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Abbasfar, A., "Generalized Differential Vector Signaling", IEEE International Conference on Communications, ICC '09, (Jun. 14, 2009), pp. 1-5.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Cheng, W., "Memory Bus Encoding for Low Power: A Tutorial", Quality Electronic Design, IEEE, International Symposium on Mar. 26-28, 2001, pp. 199-204, Piscataway, NJ.

Brown, L., et al., "V.92: The Last Dial-Up Modem?", IEEE Transactions on Communications, IEEE Service Center, Piscataway, NJ, USA, vol. 52, No. 1, Jan. 1, 2004, pp. 54-61. XP011106836, ISSN: 0090-6779, DOI: 10.1109/tcomm.2003.822168, pp. 55-59.
Notification of Transmittal of International Search Report and the Written Opinion of the International Searching Authority, for PCT/US2015/018363, mailed Jun. 18, 2015, 13 pages.
Counts, L., et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http://www.retrothing.com/2006/08/classic_analog_.html.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of the International Search Report and The Written Opinion of the International Searching Authority, or the Declaration, for PCT/US2014/015840, dated May 20, 2014. 11 pages.
Notification of Transmittal of The International Search Report and the Written Opinion of the International Searching Authority, or the Declaration, for PCT/US2014/043965, dated Oct. 22, 2014, 10 pages.
Notification of Transmittal of The International Search Report and The Written Opinion of the International Searching Authority, or The Declaration, dated Mar. 3, 2015, for PCT/US2014/066893, 9 pages.
International Preliminary Report on Patentability for PCT/US2014/015840, dated Aug. 11, 2015, 7 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The 'streTched"-Golay and other codes for high-SNR finite-delay quantization of the Gaussian source at 1/2 Bit per sample'", IEEE Transactions on Communications, vol. 38, No. 12 Dec. 1, 1990, pp. 2089-2093, XP000203339, ISSN: 0090-6678, DOI: 10.1109/26.64647.
Oh, et al., Pseudo-Differential Vector Signaling for Noise Reduction in Single-Ended Signaling, DesignCon 2009.

* cited by examiner

FIG. 1

$$H_1 = \begin{bmatrix} 1 & 1 \\ 1 & -1 \end{bmatrix}$$

$$H_2 = \begin{bmatrix} 1 & 1 & 1 & 1 \\ 1 & -1 & 1 & -1 \\ 1 & 1 & -1 & -1 \\ 1 & -1 & -1 & 1 \end{bmatrix}$$

$$H_3 = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

332 →
(1,0,0,-1,0,0,0,0) * $\frac{1}{2}$ * $\begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$

333 → =(0,1,1,0,0,1,1,0)

334 → (0,0.82,0.78,0.07,0.08,0.75,0.83,0.10)

335 →
(0,0.82,0.78,0.07,0.08,0.75,0.83,0.10) * $\frac{1}{8}$ * $\begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$

632 →
$$(2,0,0,-1,0,-1,0,0) * \frac{1}{4} * \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

633 → =(0,1,1/2,1/2,1/2, 1/2,1,0)

634 → (0, 0.68, 0.20, 0.25, 0.096, 0.19, 0.61, 0.086)

635 →
$$(0,0.68,0.2,0.25,0.096,0.19,0.61,0.086) * \frac{1}{8} * \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

STORAGE METHOD AND APPARATUS FOR RANDOM ACCESS MEMORY USING CODEWORD STORAGE

CROSS-REFERENCES TO PRIORITY AND RELATED APPLICATIONS

This application claims priority from and is a non-provisional of U.S. Provisional Patent Application No. 61/646,790, filed May 14, 2012, entitled "STORAGE METHOD AND APPARATUS FOR RANDOM ACCESS MEMORY USING CODEWORD STORAGE", the entire disclosure of which is incorporated by reference herein for all purposes.

FIELD OF THE INVENTION

The present invention relates generally to methods and apparatus for storage and retrieval of information on memory units and more particularly to structured storage.

BACKGROUND OF THE INVENTION

Memory storage is a constantly advancing field, as there is continued demand for larger memory capacities, at lower cost, lower power consumption per unit of storage and faster storage and retrieval speeds. There are different technologies that are in common use.

Storage of digital data as capacitive charges in a dynamic memory structure is well represented in the literature. Optimized logic design, innovative physical structures, and targeted semiconductor process improvements have been applied to create high density, high performance dynamic memory components of significant performance, capacity, and economy. Thus, the particular semiconductor technology used for large memory chips, such as dynamic random access memory (DRAM) chips, has been the topic of much research and DRAM technologies have been highly refined.

However, there is also a demand for comparatively small amounts of memory within, for example, a custom or semi-custom semiconductor logic device that uses a different technology. As such devices are based on different semiconductor processes and layout rules than are used to create DRAM devices, few of the optimizations developed for dedicated DRAMs are applicable to these embedded memory designs. Instead, the memory portions of such devices typically rely on planar capacitive structures of relatively low capacitance and relatively large area. Use of such relatively low capacitance, non-optimized cells can result in reduced signal output on a read operation, since readout of the stored charge is divided between the lower cell capacitance and the relatively fixed sense line parasitic capacitance. Mitigation of this effect requires the use of larger storage elements, significantly increasing the semiconductor area required for the embedded storage array.

As a result, improvements in structural design of memory would be useful.

BRIEF SUMMARY

In embodiments of a memory circuit according to aspects of the present invention, an embedded DRAM array stores information as groups of bits or data using information coding in the storage and retrieval of stored data, instead of each bit being stored separately.

In some embodiments, data is organized into data words, wherein each data word is representable as a vector having a plurality of components. In specific embodiments, the components are bits, in that they have one of two possible values. A data word that is to be stored into memory is mapped from a write data word to a storage format word. The mapping can be a mapping defined by a Hadamard matrix. The storage format word is stored as charge levels in an addressable location of the memory. An addressable location of the memory is a selectable subset of the memory is a plurality of storage cells wherein a plurality of bits of information can be stored.

For retrieving stored data, an addressable location is selected, charge levels are read from the plurality of storage cells activated when the addressable location is selected, and the charge levels are interpreted to a valid storage format word. The interpretation can be according to a maximal likelihood decoding according to a Hadamard code to derive a read data word corresponding to a previously written write data word. The write data word is then output as the result of a read of the selected addressable location, or a portion thereof.

In various embodiments, the characteristics of groups of bits are written and read collectively and optimized through the application of information coding techniques.

In a specific embodiment, an input word of B bits is mapped to an expanded word of S bits (S>B) for storage in a dynamic memory array as stored charge on S cells. On subsequent readout, the charge levels of the S cells are interpreted by an inverse mapping component that the memory device uses to reconstruct the original B bit values from the S possibly degraded signals.

In some embodiments, the mapping is a Hadamard matrix and in some embodiments, the mapping is two or more Hadamard matrix mappings concatenated for each of a plurality of storage format words.

The addressable location can be a row selection of a two-dimensional array of storage cells, such that the storage cells that collectively store a storage format word have a row selection in common. The maximal likelihood decoding can be a Fast Walsh Transform. The Hadamard code used for mapping can correspond to the Walsh codes of individual rows in a Hadamard matrix or a superposition of a plurality of Walsh codes of individual rows in a Hadamard matrix. Mapping can incorporate a distribution operation that spreads the write data word across multiple Hadamard encodings comprising the larger storage format word, and reading includes combining the result of multiple Hadamard decodings to produce the read data word. The write data word and/or the storage format word can incorporate additional error detection or error correction bits.

The following detailed description together with the accompanying drawings will provide a better understanding of the nature and advantages of the present invention.

DETAILED DESCRIPTION OF THE INVENTION

In embodiments of a memory circuit described herein, data is stored into memory, such as an embedded dynamic random access memory ("DRAM") device. Since the device is random access, it has a plurality of addressable storage locations and thus a write operation involves providing the device with a selection of an addressable storage location and write data, whereas a read operation involves providing the device with a selection of an addressable storage location and obtaining therefrom the read data.

Figure 1:
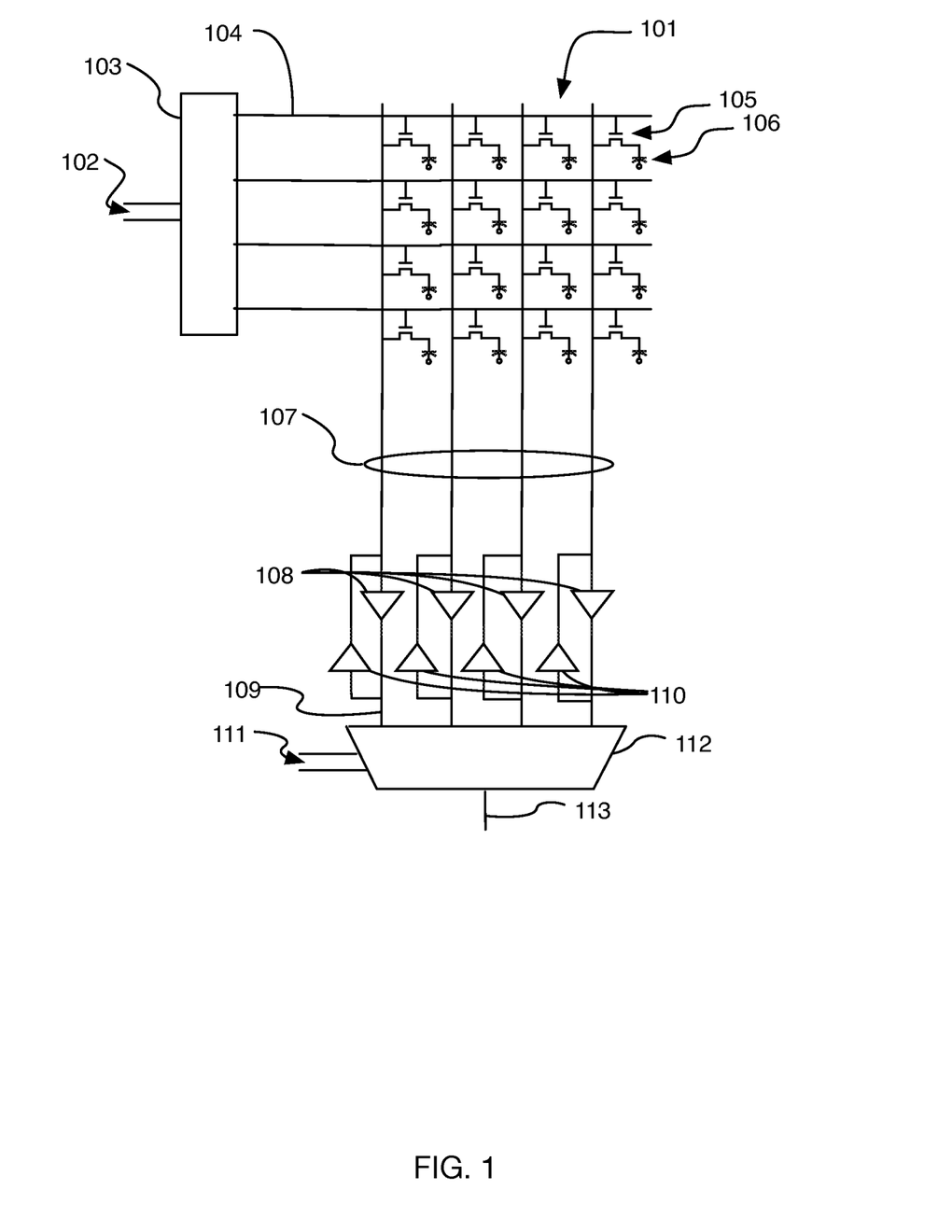
FIG. 1 is a schematic diagram showing the elements of a conventional DRAM architecture.

FIG. 1 illustrates a conventional dynamic memory array architecture that operates in this manner. Generally, the memory is organized as a two-dimensional array of M×N storage cells, for some integers M and N. Each storage cell typically comprises a cell select transistor 105 and a capacitive storage element 106, as illustrated. The address of the selected memory location can comprise a binary value of some fixed number of bits (e.g., $\log_2(M*N)$ with M and N being integer powers of two). The address can be partitioned into a $\log_2(M)$ portion referred to as a "row selection" and a $\log_2(N)$ portion referred to as a column selection." Thus, a portion of a memory address input to the memory device is decoded as a row selection address 102 to enable one of M row selection lines 104 in the array. Connected to N cell select transistor gates, the enabled row selection line turns on the associated cell select transistors 105, connecting their capacitive storage elements 106 to N column sense lines 107, allowing any charge stored on the storage capacitors to be presented as a voltage on their associated column sense lines. These voltages are measured by sense amplifiers 108, each indicating whether that column's selected cell contained a charge or no charge. The detected signals are presented as column data 109 to a column data selection multiplexor 112, which uses the column selection portion of the memory address as a column address 111 to select the portion of the column data 109 to present to data line 113, i.e., the bit value stored in the capacitive storage element 106 that is at the location in the array specified by the row selection portion and the column selection portion of the input address.

Because this DRAM read operation has drained charge from the DRAM array storage capacitors 106, a refresh operation must be performed to restore the stored data. This is done by enabling write data column drivers 110 after the sense amplifiers 108 produce their result. This drives the column data 109 back onto the column sense lines 107, recharging the DRAM array storage capacitors 106. That operation complete, the row selection line 104 is disabled, returning all cell select transistors 105 to an off state and again trapping charge in the capacitive storage elements 106.

A DRAM write cycle is performed similarly to the described read cycle, except that external write data is caused to flow from data line 113 back through the column data selection multiplexor 112 to force the sense amplifier 108 state to the desired value, causing the new data to be written to the DRAM cells as part of the concluding refresh operation. As stored charge is subject to leakage currents, it is necessary to periodically refresh (that is, perform the described read/restore operation on) each cell in the array before its charge decays to an unreadable level.

Common embodiment variations from the example of FIG. 1 include support for automatic refresh operations, use of differential sense amplifiers which measure the difference in signal between column sense lines connected to selected row cells and non-selected row cells, and column data selection multiplexing to support wider external data widths than the single data line 113 shown as an example. Current designs expand the described row/column addressing structure to encompass millions of rows and thousands of columns, often embodied as multiple banks of DRAM cell arrays within a single device.

In an ideal DRAM design, the capacitance of each storage element is identical and relatively large compared to the parasitic capacitance of the row line and sense amplifier input, and the capacitive leakage current is extremely small. These characteristics translate into a high and uniform signal level when a charged cell is read, and a long retention time between necessary refresh operations. Dedicated DRAM devices are fabricated using semiconductor processes optimized for these characteristics, capable of creating compact, high capacitance storage cells with extremely low leakage characteristics. Such process characteristics are not generally available for dynamic memory designs that are embedded within a custom or semi-custom digital logic device, as the processes used there are typically optimized for logic speed and density rather than low leakage and the ability to fabricate deep trench structures as are used to create optimized DRAM capacitive cells. Instead, designers of embedded dynamic memory arrays typically adapt available design library elements to this purpose, such as using the parasitic capacitance of a standard transistor element as a storage capacitor. Obtaining the necessary storage capacitance with such a structure requires significant planar area, so that the overall space required for the memory system is constrained by the total size of the storage array elements, rather than by minimum feature size or array signal line density as in a dedicated DRAM device.

In the example of FIG. 1, it is the case that more than one bit is read or written at a time, typically something like N bits at a time, even though the memory chip might only output less than N bits in response to a read operation or be asked to write less than N bits at one time. Memory systems are internally structured as collections of multiple bits that are read and written in parallel, although it is typically the case that the bits that are stored are independent of each other, i.e., when N bits are presented for storage, they are each stored in their own storage cell as a charge, and the same for reading.

Encoding Data as Storage Group Codes

In novel approaches described herein, when a memory device is presented with an address and data to be written, the data to be written is formed into a write data word, the memory device (such as a memory portion embedded in a circuit or chip that has other processing functions) maps the write data word into a storage format word and stores the storage format word. The write data word and the storage format word are both representable as vectors, i.e., they have a plurality of components, typically those components being bits, wherein a bit is a memory, data and/or information element that can have one of two possible logical values with physical representations that may be approximations of their logical value. Thus, in a specific embodiment, the write data word is a multi-bit value and the storage format word is also a multi-bit value. Herein, the length of the write data word is represented by an integer B, whereas the length of the storage format word is represented by an integer S. Where the length B write data word can take on up to $2^B$ different possibilities, S will be greater than B. As explained below, the S bits of a storage format word are not independent, but are defined by a codeword mapping between write data words and storage format words.

Whereas storing data involves providing the memory device with an address and a write data word, which is converted to a length S storage format word that is then stored into S memory cells, reading involves retrieving, according to the selected addressable location, charge levels from the S storage cells activated when the addressable location is selected, determining the length S storage format word and inverse mapping, preferably using a maximal likelihood decoding according to a Hadamard code to derive a read data word corresponding to a previously written write data word. The write data word is then output as the result of a read of the selected addressable location, or a portion thereof.

Of course, it may be that fewer than B bits are written at a given write operation or fewer than B bits are read. In such cases, it may be that the memory device fills in some of the bits during a write with bits of the write data word that was mapped and stored (which may involve an inverse mapping to figure out those bits) and for reading, some of the steps are skipped for some bits or some of the resulting read data word are discarded before outputting fewer than B bits. In various embodiments, the characteristics of groups of bits are written and read collectively and optimized through the application of information coding techniques. In a specific embodiment, an input word of B bits is mapped to an expanded word of S bits (S>B) for storage in a dynamic memory array as stored charge on S cells. On subsequent readout, the charge levels of the S cells are interpreted by an inverse mapping component that the memory device uses to reconstruct the original B bit values from the S possibly degraded signals.

As explained in more detail elsewhere herein, a unique approach to memory design can improve embedded DRAM arrays. Rather than attempting to improve the signal characteristics of a single bit, e.g., through increased storage capacitance, the characteristics of groups of bits written and read collectively are optimized through the application of information coding techniques. Thus, an input word of B bits is mapped to an expanded word of S bits for storage in a dynamic memory array as stored charge on S cells. On subsequent readout, the charge levels of the S cells are interpreted by an inverse mapping component that reconstructs the original B bit value from the S degraded signals. For practical memory array capacities and word lengths, the increased array density available through reduction in the size of individual storage elements needed to obtain the same system bit error rate with use of the described coding technique more than compensates for the added storage elements required.

Encoding Data as Storage Group Codes—Specific Examples

Figure 2:
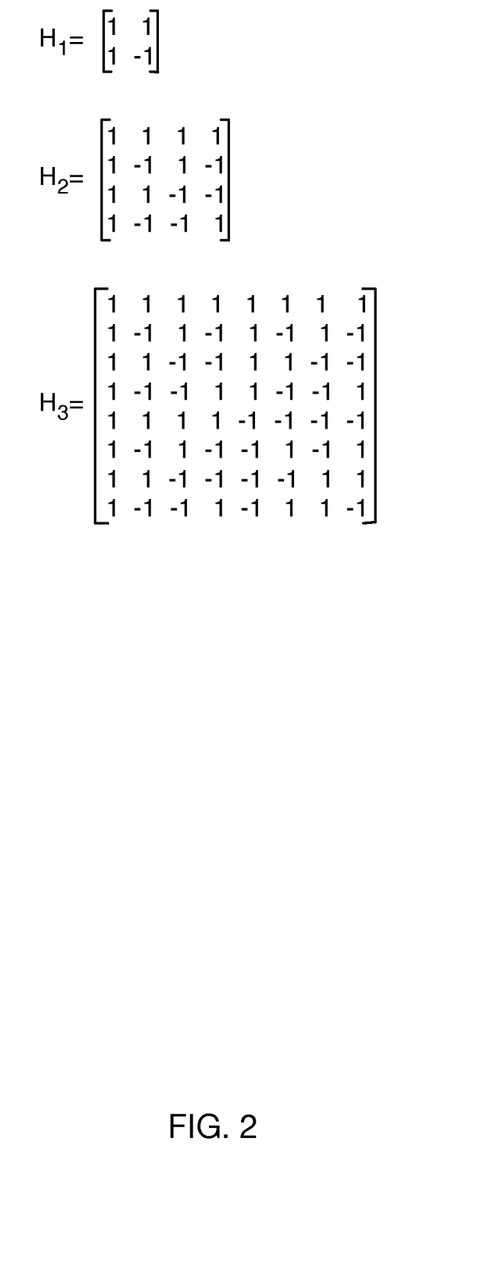
FIG. 2 illustrates examples of several Hadamard matrices.

In one specific example of a memory device, storage is constructed such that the storage format words are S=N−1 bits, where N is an integer power of two, the mapping is according to a size N Hadamard matrix size, and the write data word size is B=$\log_2$(N)−1 bits. FIG. 2 shows examples of Hadamard matrices of size N=2, N=4, and N=8. Combinations of values meeting those constraints are illustrated in Table 1.

TABLE 1

| N | Storage group size (N−1) | Stored data width (B) |
|---|---|---|
| 8 | 7 bits | 2 bits |
| 16 | 15 bits | 3 bits |
| 32 | 31 bits | 4 bits |
| 64 | 63 bits | 5 bits |

Hadamard matrices of size $2^N+4$ are also known, and are equally applicable in embodiments based on the described method. For example, a 20×20 Hadamard matrix created using Paley's construction may be used to store four bits of data in a storage group of 20 cells.

To encode a data value, K, in the range $0 \leq K < 2^B$, a numerical vector v is created of length N with the value "1" in the first position (first component), the value "−1" in the K+1-th position, and all other positions zero. For purposes of illustration, the values N=8 and B=2 will be used, allowing possible data values of {0, 1, 2, 3}, which are encoded as the numeric vectors as indicated in Table 2. It should be apparent upon reading this disclosure how to use other values for N and B.

TABLE 2

| Write Data Word | Numerical Vector (v) |
|---|---|
| 0 (e.g., 00) | (1, −1, 0, 0, 0, 0, 0, 0) |
| 1 (e.g., 01) | (1, 0, −1, 0, 0, 0, 0, 0) |
| 2 (e.g., 10) | (1, 0, 0, −1, 0, 0, 0, 0) |
| 3 (e.g., 11) | (1, 0, 0, 0, −1, 0, 0, 0) |

Figure 3:
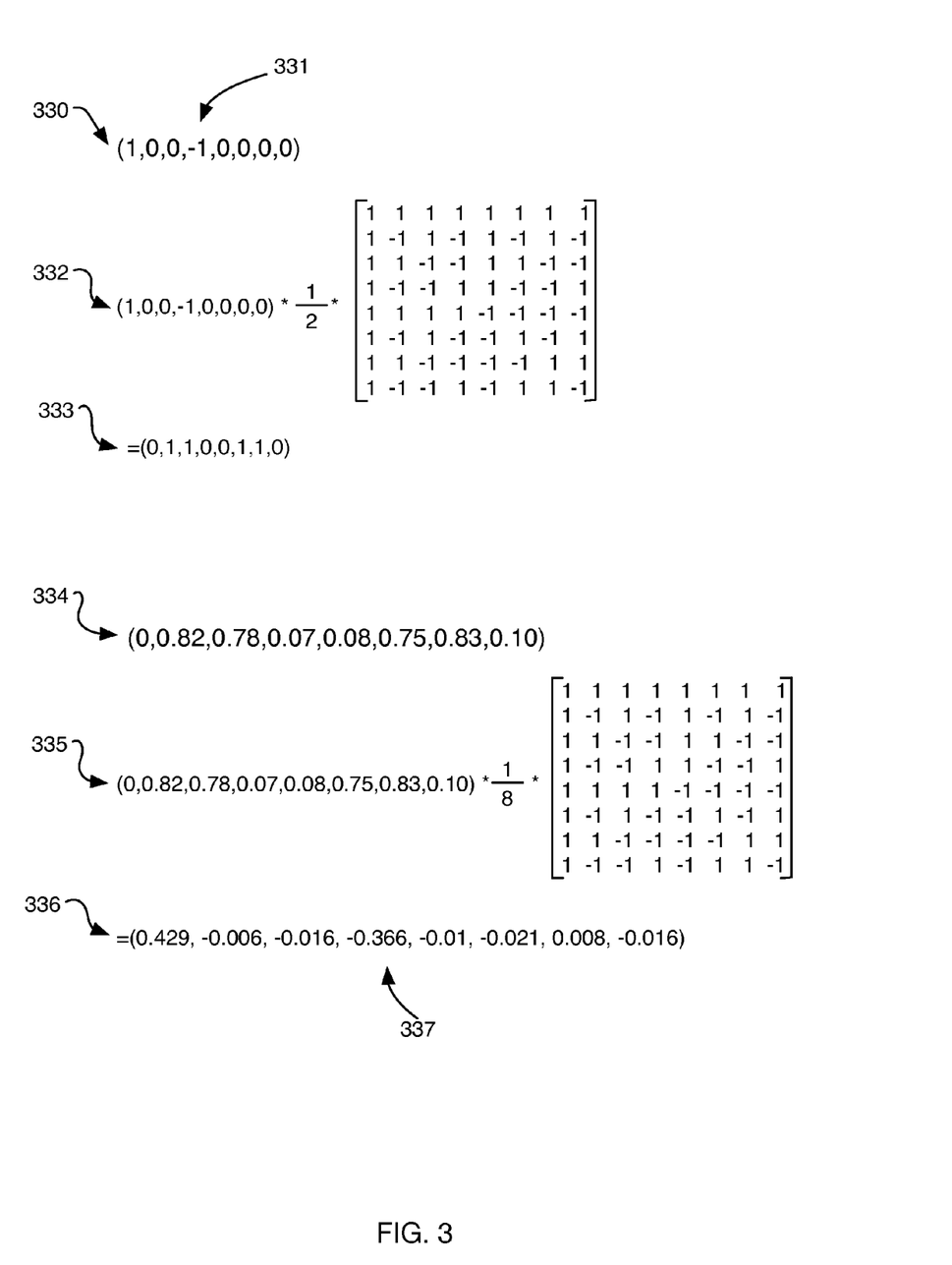
FIG. 3 shows the basic transform operations performed in an example embodiment.

FIG. 3 illustrates this example with a numeric vector 330 encoding the value "2", which may be seen by the presence of a "−1" in the fourth location 331. The chosen numerical vector is then multiplied by the Hadamard matrix $H_3$ and the result scaled by ½ to obtain the possible binary results listed in Table 3.

TABLE 3

| Write Data Word | Storage Format Word |
|---|---|
| 0 | (0, 1, 0, 1, 0, 1, 0, 1) |
| 1 | (0, 0, 1, 1, 0, 0, 1, 1) |
| 2 | (0, 1, 1, 0, 0, 1, 1, 0) |
| 3 | (0, 0, 0, 0, 1, 1, 1, 1) |

This is illustrated in FIG. 3 where the operation 332 is performed, producing the binary result 333. It should be noted that the described procedure creates binary results that correspond directly to the Walsh functions that make up the (K+1)-st row of the Hadamard matrix, where a "1" in the matrix corresponds to a binary zero, and a "−1" in the matrix corresponds to a binary one. Other embodiments may apply this equivalence to directly encode the binary results using Boolean logic or a lookup table.

Given the described construction of the numerical vector, the initial bit of the resulting binary results sequence will always be zero, and thus need not be stored but instead may be represented by the fixed value "0" on readout. The remaining seven bits of the sequence are stored in a group of seven storage cells, preferably accessed simultaneously and in parallel, such as seven array elements selected by the same array row address. For example, the sequence 333 will have its initial zero suppressed and may then be stored in seven storage cells as the sequence (1, 1, 0, 0, 1, 1, 0) to represent the data value "2" as encoded above.

In general, where a value K with $0 \leq K < 2^B$ is chosen, a vector v is created that has a "+1" at its first position, a "−1" at position K+1, and zeroes everywhere else, and the vector w=½*$H_{N+1}$*v is formed that consists of zeroes and ones only. The entries of the vector w, except possibly the first which is always zero, can be stored on N−1 cells. In general, it is also possible to use values of K between 0 and N−2, leading to N−1 choices for K. In that case, a mapping is needed that maps bits to the N−1 possible values of K. Some techniques to this end are described hereinbelow.

Decoding Data Values from Readout Charge Levels

On subsequent readout, the signals obtained from the same storage group of cells will be degraded by cell leakage and noise. Continuing the previous example, a vector v of relative values may be obtained by taking the fixed value of "0" (described above) in the first position, followed by the values obtained by reading the seven (or more generally, N−1) storage cells written with the previous sequence. An example result is shown as 334, with individual values representing both leakage decay of stored "1" values, which may vary from cell to cell, and noise-induced variation of all signal levels.

The Hadamard transform of this vector 334 is taken at 335, producing the result 336. It may be noted that the overall form of this result vector 336 is the same as that used to generate the numerical vector 330 used for storage; that is, a significantly positive value, followed by some arrangement of one significantly negative value 337 and six values near zero. In the ideal case having neither signal level degradation nor noise, the sequence read from the storage cells would be a series of "1" and "0" values, and the result vector obtained after the matrix multiplication would exactly match the original numeric vector used in the encoding process.

Given knowledge of this expected form, conventional techniques may be applied to identify which of the possible variations of that form (i.e., which of the possible numeric vectors that could have been used for the storage operation) is the greatest likelihood match of 336 to one of the possible numeric vectors which could have produced it. One embodiment performs this match by finding the most negative value in 336, here −0.366 in the fourth position 337, which corresponds to the encoding method's representation of the value K=2 as a "−1" value 331 in the fourth position of the original numerical vector 330 of this example.

Some embodiments may use an equivalent operation to the Hadamard transform, such as a Fast Walsh transform. Other embodiments may incorporate additional consistency checks of the readout transformed sequence to further verify it is of the same overall form expected for an encoded sequence, such as having its most positive value in the first position, that the values approximating zero have amplitudes below a set threshold, etc.

Storage Cell Scaling Reduction of Array Size

The above example utilizes seven storage cells to encode a two bit value, which appears to be a significant storage inefficiency. Indeed, for higher values of N, this apparent cells/bit inefficiency only appears to grow. However, systems with larger matrix size (that is, larger N) also display significantly improved decoding gain, in other words an ability to tolerate lower signal to noise ratios on readout.

A study and error analysis of the overall system using a second moment analysis over random perturbations showed that the necessary array capacitance (or equivalently, the required area of the array storage cell) may be scaled down by a factor of around 2/N while maintaining the same overall bit error rate. Depending on the topology used for detection of the signals, actual scale downs of between 2/N and 4/N may be suitable. Including this scale improvement factor, the overall array size reduction obtainable over a conventional one bit/cell array for some example matrix sizes is as shown in Table 4.

TABLE 4

| Matrix | Cells/Bit | 2/N scale Factor | 4/N Scale Factor | Overall Scale Factor |
|---|---|---|---|---|
| $H_3$ | 7/2 | 1/4 | 1/4 | 0.875 − 1.75 |
| $H_4$ | 15/3 | 1/8 | 1/2 | 0.625 − 1.3 |
| $H_5$ | 31/4 | 1/16 | 1/8 | 0.484 − 0.9688 |
| $H_6$ | 63/5 | 1/32 | 1/16 | 0.3938 − 0.7875 |
| $H_7$ | 64/3 | 1/64 | 1/32 | 0.333 − 0.666 |

Scaling of array storage elements will affect the required refresh rate if standard sense amplifier signal level refresh is used. Some embodiments instead implement refresh at the data bit level rather than the array bit level, performing the full Hadamard decode and encode for each refresh cycle. Other embodiments may simplify that behavior by decoding only to the point of determining which matrix row (e.g., Walsh function) best matches the readout data pattern, followed by a write back of that row's Walsh function bit pattern. Embodiments utilizing more complex data encoding patterns may extend that method to a best match of superpositions of Walsh functions.

Integration of Storage Group Coding into a DRAM Subsystem

Figure 4:
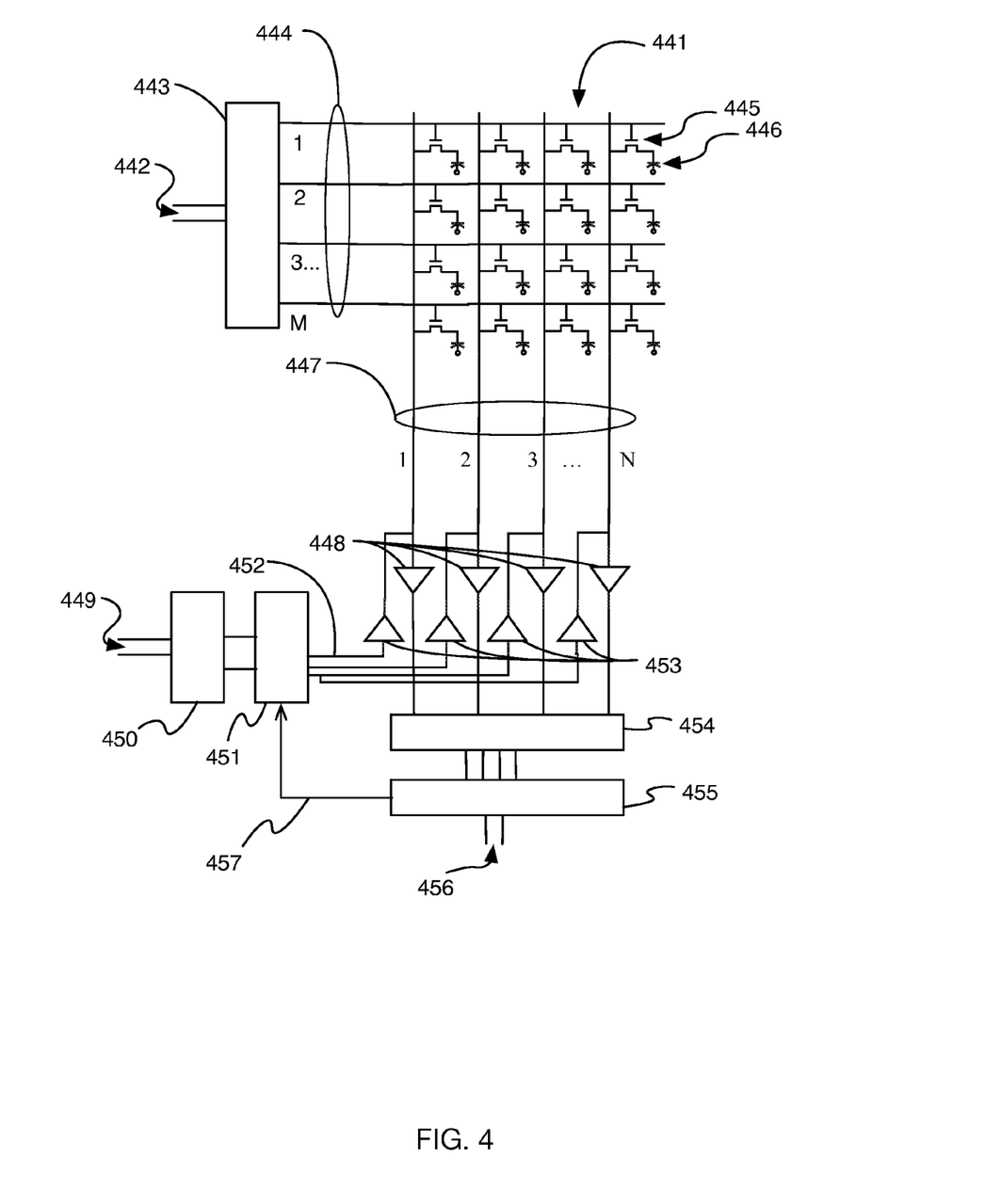
FIG. 4 is a schematic diagram of Hadamard encoded storage in a DRAM array.

FIG. 4 shows an exemplary embodiment of Hadamard encoded storage in a DRAM array. DRAM array 441 comprises a multiplicity of DRAM array cells, each connected to one of M row selection lines 444 and one of N column sense lines 447. When enabled by a selected row selection line 444, the attached DRAM element pass transistor 445 connects its associated DRAM element storage capacitor 446 to a column sense line 447.

Concurrently, data to be written 449 is encoded by a write data mapping operation 450 into a vector of encoded values, which undergoes a Hadamard encoding operation 451 to create a Hadamard encoded storage word 452 that can be placed on a set of wires or a bus as illustrated. It should be understood that the "operation" elements shown in FIG. 4 could be implemented with dedicated circuitry or the like that implements the transformations, mapping, etc. described elsewhere herein. It should also be understood that, depending on context, the references in the figures may refer to wires or channels, but might refer to the data carried on those wires or channels.

The individual values of the Hadamard encoded storage word 452 are driven by encoded write data drivers 453 onto the column sense lines 447, creating a pattern of charged cells in the selected DRAM element storage capacitors 446. All row selection lines 444 are then disabled, trapping the stored charges in the array cells.

Subsequently, the same row address 442 is presented to row address decoder 443, enabling one of the row selection lines 444. When enabled by the selected row selection line 444, each of the attached DRAM element pass transistors 445 for that row connects its associated DRAM element storage capacitor 446 to a column sense line 447. The charge stored on the DRAM element storage capacitor 446 presents a voltage on the column sense line 447, which is detected by the sense amplifier 448. The detected signals pass through a Hadamard decoder 454 (as might be implemented to match the logic described above for inverse mapping) and the results provided to a read data decoder 455 that then performs greatest likelihood matching and outputs results as a decoded read data word 456. Finally, information from the read operation may be returned along a channel 455 to a Hadamard encoder operation 451 to produce Hadamard encoded storage format words to be written back through encoded write data drivers 453 to DRAM array 441.

In some embodiments, Hadamard encoding operation 451 is implemented as a circuit that performs a Hadamard transform, i.e., it transforms its input according to a Hadamard transform, such as one described herein, and provides the result as its output. In a specific circuit implementation, a resistor network encodes for the Hadamard transform and the transform can be performed quickly and without undue overhead. In some embodiments, Hadamard decoding operation 545 is also done with a resistor network and decoder 455 is a circuit that performs peak detection to find the position of a vector that has the lowest entry.

Improved Storage Encoding Efficiency

A practical storage system is often desired, to handle data significantly wider than the two bit data width of the previous example. For example, the size of the write data words might be bytes (8 bits) or words (16 bits) rather than two bits. In one approach that addresses this need, such systems incorporate multiple instances of the mapper. For example, four instances of the N=8/B=2 Hadamard mapper might be used in parallel, each handling two bits to support an overall storage interface width of eight bits.

Simply paralleling multiple embodiments in this fashion does not provide the most efficient utilization of storage resources and further improvements are possible. Consider the previous N=8 encoding example. Additional encoded values are possible within the described numerical vector format. For example, a numerical vector formatted as a single "1" followed by some combination of a single "−1" and six zeroes can encode seven different values, where the example only employed four of those. To take advantage of these additional states in a multiple-instance system, an additional information spreading procedure may be applied.

As a simple example, two N=8 subsystems, $N_1$ and $N_2$, as described in the earlier example can actually represent 7*7=49 distinct sets of states, which is more than the 32 states needed to represent any five bit value. But, taken individually, the subsystems $N_1$ and $N_2$ cannot take advantage of those additional states, as by itself neither can represent enough states to encode an additional bit.

Consider now that a five bit vector, $V=(V_4, V_3, V_2, V_1, V_0)$, is to be mapped to the states of the two N=8 subsystems, $N_1$ and $N_2$. One simple information spreading procedure to map the five bit binary value of V to the states 0 to 5 on each of $N_1$ and $N_2$ uses the following procedure:

1) If $V_4$=0, encode states $N_1$={0, 1, 2, 3} and $N_2$={0, 1, 2, 3} as:
   $N_1=2*V_4+V_3$, and $N_2=2*V_2+V_1$
   If $V_4$=1 and $V_3$=0, encode states $N_1$={0, 1, 2, 3} and $N_2$={4, 5} as
   $N_1=2*V_2+V_1$, and $N_2=4+V_0$
   If $V_4$=1 and $V_3$=1, encode states $N_1$={4, 5} and $N_2$={0, 1, 2, 3}
   $N_1=4+V_0$, and $N_2=2*V_2+V_1$ As previously described, the resulting states $N_1$ and $N_2$ are then encoded as numeric vectors ranging from 0=(1, −1, 0, 0, 0, 0, 0, 0) to 5=(1, 0, 0, 0, 0, 0, −1, 0) and those numeric vectors are each separately multiplied by the Hadamard matrix $H_3$ and the result scaled by ½ to obtain the possible binary results to be stored in the two seven-bit storage groups of cells. Extending this example, a Boolean logic layer or lookup table can be used to map an 8 bit value to three 1-of-7 state values (since 7*7*7=343 and 343>256, so all eight bit numbers can be distinctly represented) which are then encoded for storage in three N=8 subsystems.

On readout, the voltage levels obtained from the seven-bit storage groups of cells are decoded as previously described to obtain state values, which are then applied to an inverse lookup table or Boolean logic layer to reconstruct the original binary value (five bits from two storage groups of cells in the first example, eight bits from three storage groups of cells in the extended example.)

Figure 5:
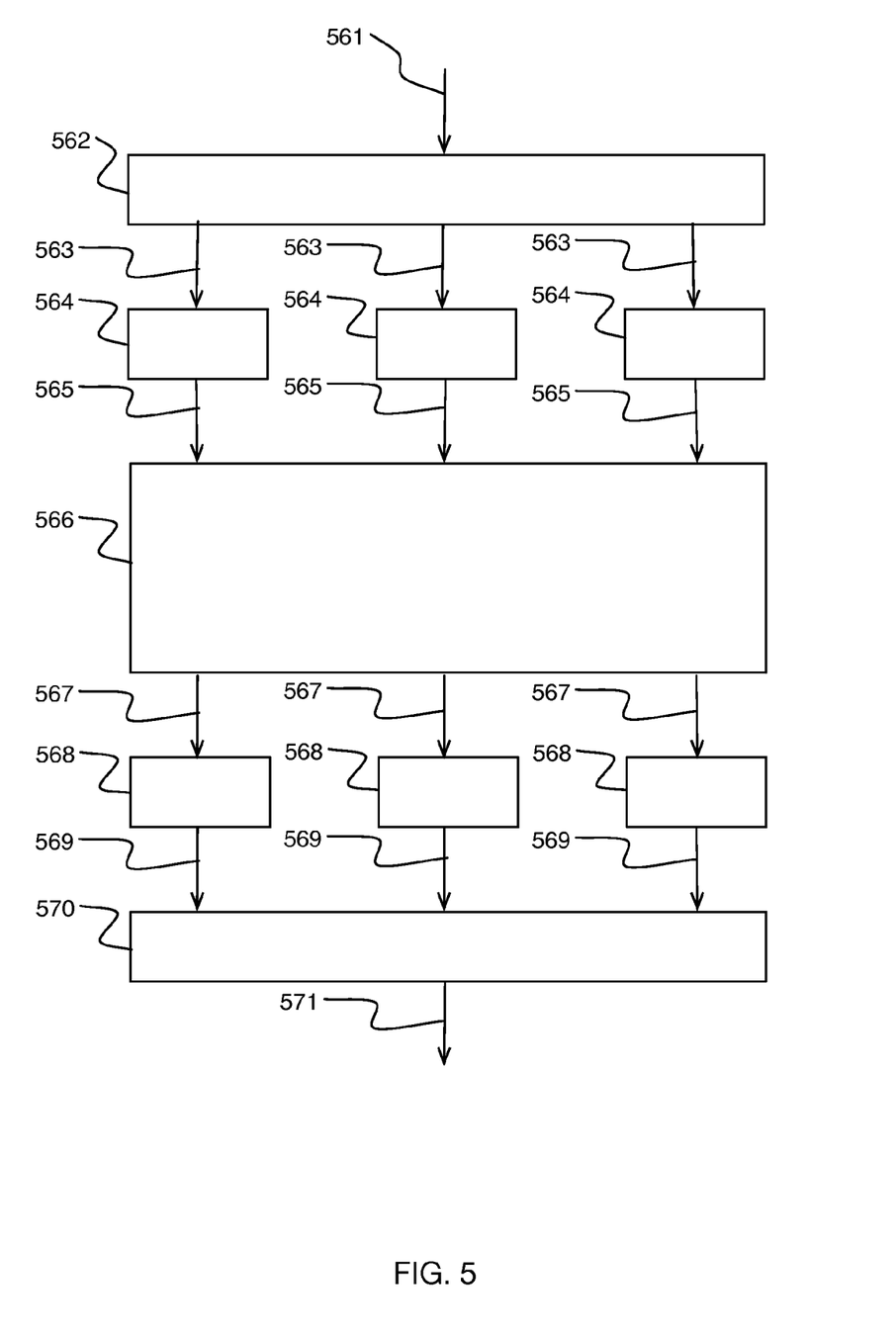
FIG. 5 illustrates multiple instances of Hadamard encoded storage combined into a larger system.

FIG. 5 illustrates multiple embodiments such as shown in FIG. 4 combined into a larger system in this fashion. Input data to be written to the storage system 561 undergoes a data spreading and encoding operation 562, creating sets of state vectors 563 which in combination represent the input data 561. Each of the state vectors 563 undergoes Hadamard matrix encoding 564 to produce sets of Hadamard encoded write data 565 that are stored in DRAM array 566. Subsequently, the same DRAM array elements are read, producing sets of Hadamard encoded read data 567 which undergo Hadamard matrix decoding 568, producing multiple decoded state vectors 569 which are presented to the data aggregation and decoding operation 570, to produce the output data result 571.

The particular mapping processes, circuits and/or structures used to first spread and later combine the data provide a unique mapping between input value to state values to output value, and should do so with relatively uniform distribution over the available set of state values, but otherwise may be chosen based on implementation convenience. On encoding, an embodiment may combine the mapping or information spreading and the encoding operations, directly producing multiple Hadamard-coded storage values based on an input value. Similarly, an embodiment of the decoding operation may combine Hadamard decoding and the inverse mapping or combining action in a single operation, or may selectively implement some portions as parallel operations.

With this enhanced encoding, the delivered storage density for some example stored data widths and matrix complexities are as shown in Table 5.

TABLE 5

| Sub-systems | Data bits (B) | Storage Bits (S) | Cell Scale Factor | Overall Scale Factor |
|---|---|---|---|---|
| 3 × $H_3$ | 8 | 3 * 7 = 21 | 1/4 | 0.656 |
| 5 × $H_4$ | 19 | 5 * 15 = 75 | 1/8 | 0.493 |
| 7 × $H_5$ | 34 | 7 * 31 = 217 | 1/16 | 0.399 |
| 6 × $H_6$ | 35 | 6 * 63 = 378 | 1/32 | 0.337 |

As may be seen from this disclosure, even a fairly simple implementation based on 8×8 Hadamard matrices or the equivalent Fast Walsh-Hadamard transform may require as little as 66% of the semiconductor area of an embedded dynamic memory subsystem designed using conventional techniques.

More Complex Encoding Methods

The previous examples utilize an encoding of data bits in a numeric vector which, when transformed by the Hadamard matrix, produces a binary storage pattern corresponding to a single Walsh function. This selection of patterns provides certain benefits with respect to high correlation within the decoding process and a result vector having a simple to analyze form. However, higher storage efficiency might sometimes be desired, using fewer storage bits to store a given number of data bits.

Other tradeoffs are possible; one embodiment utilizes numeric vectors of the form "2" followed by a sequence containing two "−1" values and all other values zero. When multiplied by the Hadamard matrix in the encoding process, and divided by 4, such a pattern produces a result that is the equivalent of the additive superposition of two Walsh functions, rather than the binary representation of a single Walsh function of the earlier example. That is, a range of charge levels is stored in particular cells within the selected storage group to represent the encoded sequence, rather than the binary selection of a single charge level or no charge per cell.

On decoding, analysis of the result vector obtained after the Hadamard matrix operation is similarly interpreted relative to this more complex expected pattern having significantly negative values in two positions. The additional degree of freedom allows significantly more states to be encoded, thus permitting higher storage efficiency at the cost of more complex processing functions and somewhat lower noise immunity.

Figure 6:
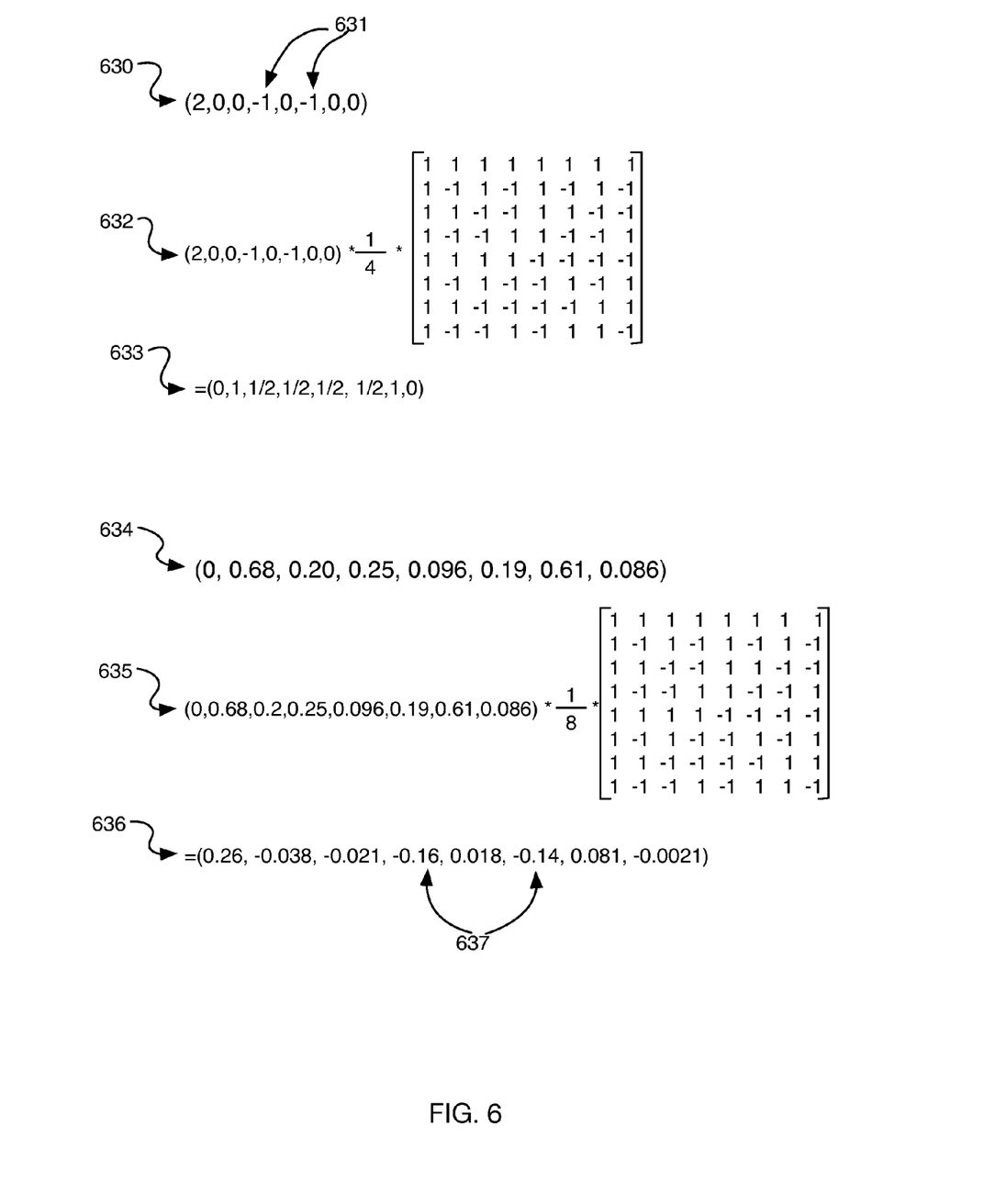
FIG. 6 illustrates another example.

FIG. 6 provides an example. There, a vector 630 is encoded in this example. This vector has a "2" at position 1, and two "−1"s at positions 4 and 6, indicated by 631. The Hadamard transform of this vector, scaled by ¼, is computed in 632 to obtain the resulting vector in 633 having coordinate values 0, ½, and 1. These values may be stored on the eight cells. An example of a vector of charges read from the cells is shown as 634, with individual values representing both leakage decay of stored "1" values, which may vary from cell to cell, and noise-induced variation of all signal levels.

The Hadamard transform of this vector 634 is taken at 635, producing the result 636. It may be noted that the overall form of this result vector 636 is the same as that used to generate the numeric vector 630 used for storage; that is, a significantly positive value, followed by some arrangement of two significantly negative values 637 and five values near zero. These two values could be determined using circuitry that can detect the positions of the two smallest entries in the vector.

Further embodiments extend this concept to numeric vectors of the form (w, . . . ) where w is the weight of the vector, and " . . . " is a sequence of entries containing w values of −1 and the remainder values of 0. Such embodiments identify the w most negative values in the result vector after the Hadamard transform within the decoding process.

In the examples described herein, Hadamard matrices are used to form the basis for an encoder and decoder. In other embodiments, other orthogonal matrices might be used instead, however initial analysis may indicate that Hadamard matrices are preferred.

Hybrid Error Detection and Correction

The described methods may also be used in combination with known techniques for error correction and error identification, including single and multi-dimensional parity codes, low density parity codes, and forward error correction codes including Reed-Solomon, Golay, BCH, and Hamming code. These techniques, collectively called ECC, may be applied over blocks or words of data presented to the external interface of the storage subsystem, or to storage code groups written and read from sets of physical memory cells. One example embodiment computes ECC across seven bit storage code groups and stores the storage code groups with the computed ECC.

As has now been explained, systems and methods that combine Hadamard coding of storage formatted words with a dynamic memory storage array provide improved signal integrity and error reduction. The systems and methods are applicable to embodiments that are constrained by the planar area required for each capacitive component of the dynamic memory array, as the improved read detection ability can compensate for reduced cell capacitance, permitting significant array size reduction. Further embodiments are described that aggregate multiple instances of the described system and method into larger configurations, and which combine those methods with other error detection and error correction methods.

What is claimed is:

1. A method comprising:
   accepting a write data word, wherein the write data word is representable as a vector having a plurality of components;
   mapping the write data word to a storage format word of a plurality of storage format words, wherein the storage format word is representable as a vector having a plurality of components wherein each storage format word represents a subtraction between (i) a weighted all-one Walsh function and (ii) a respective unique summation of at least one Walsh function of a plurality of Walsh functions, the all-one Walsh function corresponding to an all-one row of a Hadamard matrix and each Walsh function of the plurality of Walsh functions corresponding to a respective row of the Hadamard matrix, and wherein the components of the storage format-word vector have magnitudes greater than or equal to zero;
   determining a selected subset of the plurality of storage cells according to an address input; and
   storing the components of the storage format word as charge levels on the selected subset of the plurality of storage cells.

2. The method of claim 1, wherein each storage cell in the selected subset is configured to store a bit value, the bit value having one of two possible logical values, and storing a charge level comprises storing one of two possible charge levels.

3. The method of claim 1, wherein each component of the vector representing a write data word is a bit, the bit having one of two possible logical values and accepting each component comprises reading one of two possible logical values.

4. The method of claim 1, further comprising:
   determining a read target address;
   determining a selected read target subset of the plurality of storage cells according to the read target address;
   measuring the charge levels on the multiple storage cells of the selected read target subset;
   interpreting the measured charge levels as a maximal likelihood decoding of a presumed write data word; and
   producing a read data word from the interpreted charge levels.

5. The method of claim 4, wherein mapping further comprises a distribution operation that spreads the write data word across multiple Hadamard encodings, each Hadamard encoding comprising a respective storage format word, and producing further comprises combining the result of the multiple Hadamard decodings to produce the read data word.

6. The method of claim 4, wherein the maximal likelihood decoding comprises decoding a Hadamard code, wherein decoding the Hadamard code comprises using a Fast Walsh Transform.

7. The method of claim 1, wherein the subset of the plurality of storage cells is selected by an array address comprising a row selection element and a column selection element, individual cells within the selected subset having at least the row selection element in common.

8. The method of claim 1, where at least one of the write data word and the storage format word incorporates additional error detection or error correction bits.

9. The method of claim 1, wherein the write data word comprises B elements, and the storage format word comprises $2^{B+1}-1$ components, wherein B is an integer greater than or equal to 1.

10. The method of claim 1, wherein the summation of at least one Walsh function comprises n Walsh functions, and a weight of n is applied to the all-one Walsh function, wherein n is an integer greater than or equal to 1.

11. A system for storing digital data, comprising:
    a dynamic memory structure of multiple storage cells configured to retain a volatile electrical charge;
    a signal encoder configured to create a Hadamard coded storage format word from a data input, wherein the storage format word is representable as a vector having a plurality of components wherein each Hadamard coded storage format word represents a summation of (i) a weighted all-one Walsh function and (ii) a respective unique summation of at least one Walsh function of a plurality of Walsh functions, the all-one Walsh function corresponding to an all-one row of a Hadamard matrix and each Walsh function of the plurality of Walsh functions corresponding to a respective row of the Hadamard matrix, and wherein the components of the storage format-word vector have magnitudes greater than or equal to zero;

a dynamic memory write circuit configured to store the Hadamard coded storage format word as charge levels on a selected subset of the multiple storage cells;

a dynamic memory read circuit configured to measure the charge levels on a selected subset of the multiple storage cells;

a signal decoder configured to interpret the measured charge levels as a maximal likelihood decoding of the Hadamard coded storage format word; and a data output derived from the maximal likelihood decoding.

12. The system of claim 11, further comprising a dynamic memory refresh circuit configured to:

obtain the maximal likelihood decoding of the Hadamard coded storage format word;

create a new Hadamard coded storage format word from the maximum likelihood decoding; and store the new Hadamard coded storage format word as charge levels on the same selected subset of the multiple storage cells.

13. The system of claim 11, wherein the data input comprises B elements, and the Hadamard coded storage format word comprises $2^{B+1}-1$ components, wherein B is an integer greater than or equal to 1.

14. The system of claim 11, wherein each storage cell is configured to store a bit value, the bit value having one of two possible logical values, and the dynamic memory write circuit is configured to store each charge level as one of two possible charge levels.

15. The system of claim 11, wherein each component of the vector representing a write data word is a bit, the bit having one of two possible logical values and the signal encoder is configured to detect each component by reading one of two possible logical values.

16. The system of claim 11, wherein each component of the Hadamard coded storage format word comprises values selected from a set of three possible values.

17. The system of claim 16, wherein each value in the set of three possible value has a magnitude greater than or equal to 0, and less than or equal to 1.

18. The system of claim 16, wherein the dynamic memory write circuit is configured to store each charge level as one of three possible charge levels.

19. The system of claim 11, wherein the summation of at least one Walsh function comprises n Walsh functions, and a weight of n is applied to the all-one Walsh function, wherein n is an integer greater than or equal to 1.

20. The system of claim 11, where at least one of the data input and the Hadamard coded storage format word incorporates additional error detection or error correction bits.

* * * * *